United States Patent [19]

Sugawa et al.

[11] Patent Number: 4,879,470
[45] Date of Patent: Nov. 7, 1989

[54] PHOTOELECTRIC CONVERTING APPARATUS HAVING CARRIER ELIMINATING MEANS

[75] Inventors: Shigetoshi Sugawa; Yoshio Nakamura, both of Atsugi; Nobuyoshi Tanaka, Tokyo; Isamu Ueno, Atsugi, all of Japan

[73] Assignee: Canon Kabushiki Kaisha, Tokyo, Japan

[21] Appl. No.: 143,186

[22] Filed: Jan. 13, 1988

[30] Foreign Application Priority Data

Jan. 16, 1987 [JP] Japan .................. 62-006252
Jan. 16, 1987 [JP] Japan .................. 62-006255
Mar. 31, 1987 [JP] Japan .................. 62-077951

[51] Int. Cl.$^4$ ............................. H01J 40/14
[52] U.S. Cl. .................. 250/578; 250/211 J; 358/213.16; 357/30
[58] Field of Search ............ 250/578, 211 R, 211 J; 358/213.11, 213.16, 213.27; 357/30 L

[56] References Cited

U.S. PATENT DOCUMENTS

| | | | |
|---|---|---|---|
| 3,858,233 | 12/1974 | Miyata et al. | 357/30 L |
| 4,096,512 | 6/1978 | Polinsky | 357/30 L |
| 4,300,163 | 11/1981 | Wada et al. | |
| 4,334,151 | 6/1982 | Herbst et al. | |
| 4,354,104 | 10/1982 | Chikamura et al. | 357/30 L |
| 4,455,574 | 6/1984 | Hashimoto et al. | |
| 4,621,275 | 11/1986 | Ueno et al. | 357/30 L |
| 4,691,244 | 9/1987 | Cannella et al. | 357/30 L |

FOREIGN PATENT DOCUMENTS

0226338 6/1987 European Pat. Off. .
60-32486 2/1985 Japan .

OTHER PUBLICATIONS

Interline CCD Image Sensor with an AntiBlooming Structure, Yasuo Ishihara, et al.

*Primary Examiner*—Edward P. Westin
*Assistant Examiner*—Khaled Shami
*Attorney, Agent, or Firm*—Fitzpatrick, Cella, Harper & Scinto

[57] ABSTRACT

In a photoelectric converting apparatus having a plurality of photosensors divided into an opening portion and a light shielding portion, a carrier eliminating structure to block the inflow of photosignals from the opening portion is provided between the photosensor in the light shielding portion and the photosensors in the opening portion. The photosensor comprises of a photoelectric converting transistor having a control electrode region to accumulate the carriers generated by the light excitation. The carrier eliminating structure has the same constitution as that of the photosensor. The potential of the control electrode region is fixed to a constant potential so as to attract the carriers from the opening portion.

24 Claims, 10 Drawing Sheets

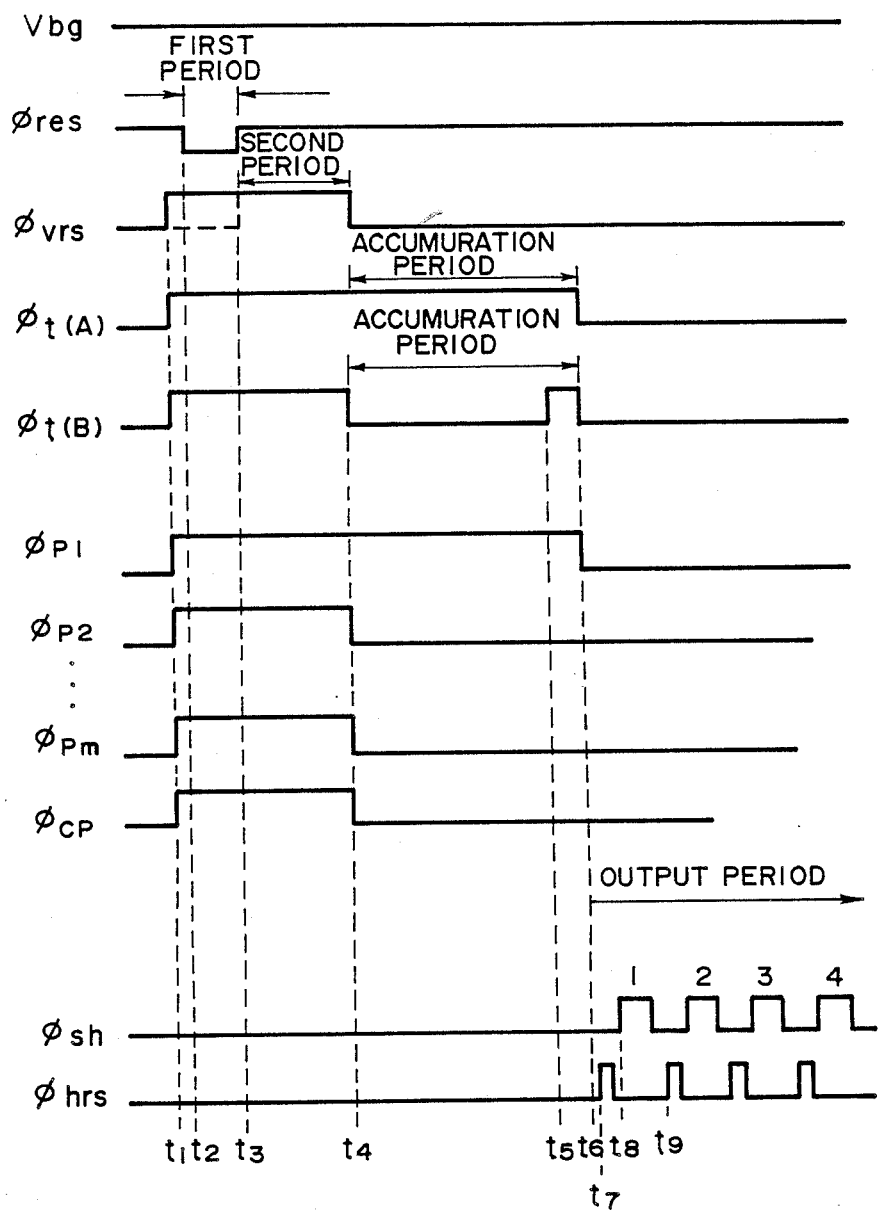
F I G. 12

PHOTOELECTRIC CONVERTING APPARATUS HAVING CARRIER ELIMINATING MEANS

BACKGROUND OF THE INVENTION

1. Field of the Invention

The present invention relates to a photoelectric converting apparatus having a plurality of photosensors which are divided into an opening portion and a light shielding portion.

2. Related Background Art

FIG. 1 is a schematic constitutional diagram of a conventional photoelectric converting apparatus having the dark output compensating function.

In the diagram, a sensor section 1 comprises cells $S_1$ to $S_n$ in the opening portion to perform photoelectric conversion and a cell $S_d$ in the light shielding portion to obtain a dark reference output.

Signals of the cells are sequentially output by a scan section 2 and input to a dark output compensation section 3. The dark output compensation section 3 subtracts a dark reference signal amount of the cell $S_d$ from the signals of the cells $S_1$ to $S_n$ and outputs the result.

Since the output of the sensor cell $S_d$ in the light shielding portion corresponds to a dark current of the sensor cell, by subtracting the dark reference signal amount of the cell $S_d$ from the signals of the cells $S_1$ to $S_n$, the noise components of the dark current are eliminated. Thus, a photoelectric conversion signal which accurately corresponds to the incident light can be derived.

A clamping circuit can be used as the dark output compensation section 3, or it is also possible to use a sample and hold circuit to hold the dark reference signal of the cell $\underline{S_d}$ and a differential circuit to obtain the differences between the dark reference signal and the signals of the cells $S_1$ to $S_n$.

FIG. 2 is a schematic cross sectional view of the sensor section 1 in the foregoing conventional apparatus.

In the diagram, the sensor cells $S_d$ and $S_1$ to $S_n$ are formed in a line in an n⁻ layer 701 through device separating regions 702.

Each cell has a p region 703 to accumulate the carriers generated by the light excitation. A light shielding film 704 is formed on the cell $S_d$, thereby constituting a light shielding portion.

However, the foregoing conventional photoelectric converting apparatus has a problem such that when strong light enters the opening portion, the carriers leak from the opening portion to the light shielding portion and exert an adverse influence on the dark reference output.

Namely, as shown in FIG. 2, when the strong light enters and the excess carriers (in this case, holes) are accumulated in the p region 703 of the cell $S_1$ in the opening portion, these excess carriers 705 flow out to the side of the n⁻ layer 701 and flow into the p region 703 of the cell $S_d$ in the adjacent light shielding portion. Thus, the dark reference output of the cell $S_d$ changes and the foregoing accurate dark output compensation cannot be performed.

The foregoing conventional photoelectric converting apparatus also has the following problems.

First, there is a case where a part of the holes generated in the substrate by the incident light move in the substrate and flow into the adjacent pixel.

Second, when the strong light enters, a large quantity of holes are accumulated in the p base region, so that the base potential increases. When the base potential rises to a value higher than the collector potential, the depletion layer between the base and the collector is extinguished and the holes accumulated in the base flow out to the adjacent cell.

As explained above, when the holes moved from the other pixel flow into the p base region of the adjacent cell, the readout signal of this pixel does not correspond to the incident light, resulting in a smear when an image is reproduced, so that the picture quality remarkably deteriorates.

SUMMARY OF THE INVENTION

It is an object of the present invention to provide a photoelectric converting apparatus which can solve the foregoing drawbacks in the conventional technique.

Another object of the invention is to provide a photoelectric converting apparatus in which the signals of photosensors in the opening portion are not mixed into the signal of photosensor in the light shielding portion.

Still another object of the invention is to provide a photoelectric converting apparatus in which the light is measured by use of a signal in the photosensor section and a photometric area can be easily selected.

Still another object of the invention is to provide a photoelectric converting apparatus which can reduce the smear caused between the adjacent photosensor cells.

According to an embodiment of the present invention, in a photoelectric converting apparatus having a plurality of photosensors divided into an opening portion and a light shielding portion, carrier eliminating means for blocking the inflow of photosignals from an opening portion is provided between a photosensor in the light shielding portion and a photosensor in the opening portion.

By providing the carrier eliminating means between the opening portion and the light shielding portion as explained above, the leakage of the photosignals from the opening portion is blocked and an output which is not influenced by the light can be derived from the sensor in the light shielding portion.

To solve the foregoing conventional problems, according to another embodiment of the invention, in a photoelectric converting apparatus having a photometric function in which a plurality of photosensors are arranged, selecting means which can select the photosensor in a desired portion among those plurality of photosensors is provided and the light measurement can be performed by the selected photosensor.

Since the sensor section to perform the light measurement such as peak value detection, mean value detection, and the like can be arbitrarily switched by the selecting means, the optimum peak value, mean value, or the like adapted to process the readout signal can be obtained.

According to still another embodiment of the invention, in a photoelectric converting apparatus having an accumulation region of a semiconductor of one conductivity type for accumulating carriers generated by light excitation, a first region of a semiconductor of the opposite conductivity type which is joined to the accumulation region and a second region of the semiconductor of one conductivity type which is joined to the first region are provided in a depth direction of the accumulation region.

In this manner, the first and second regions of the different conductivity types are provided in the depth direction of the accumulation region and the second region is set to a proper potential. Due to this, the carriers generated in the deep portion below the joint portion of the first and second regions or the carriers overflowed from the accumulation region can be eliminated to the second region side. The outflow of the carriers to the adjacent region can be prevented.

The above and other objects and features of the present invention will become apparent from the following detailed description and the appended claims with reference to the accompanying drawings.

BRIEF DESCRIPTION OF THE DRAWINGS

FIG. 12 is a timing chart showing an example of timings for respective pulses which are output from the driver 77;

DETAILED DESCRIPTION OF THE PREFERRED EMBODIMENTS

An embodiment of the present invention will be described in detail hereinbelow with reference to the drawings.

Figure 3:
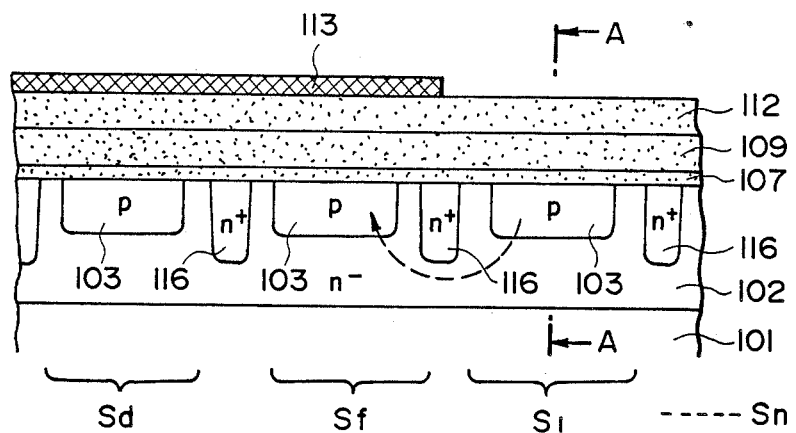
FIG. 3 is a schematic cross sectional view of an embodiment of a photoelectric converting apparatus according to the present invention.
Figure 4:
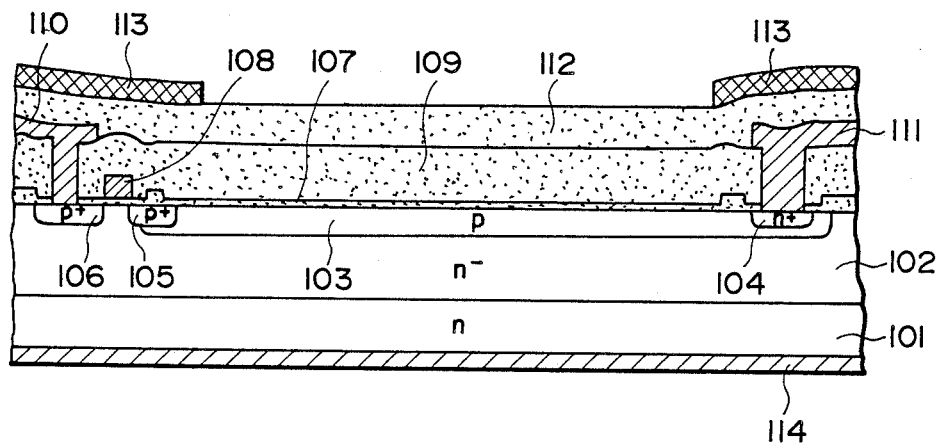
FIG. 4 is a cross sectional view taken along the line A—A in the embodiment shown in FIG. 3.

FIG. 3 is a schematic cross sectional view of an embodiment of a photoelectric converting apparatus according to the invention. FIG. 4 is a cross sectional view taken along the line A—A in FIG. 3.

In FIGS. 3 and 4, an n⁻ layer is formed on an n type substrate 101 by an epitaxial growth. The cells $S_d$, $S_1$, $S_2$, ..., $S_n$ and an excess carrier eliminating cell $S_f$ are formed in a line in the n⁻ layer so as to be separated from each other by device separating regions 116. The excess carrier eliminating cell $S_f$ is located between the cell $S_d$ and the cell $S_1$. The n⁻ layer serves as a collector region 102 in each cell.

A p base region 103 is formed in each cell. An n+ emitter region 104 is formed in each p base region 103. Thus, an npn type bipolar transistor is formed.

A p+ region 105 is formed in the p base region 103. A p+ region 106 is formed in the n⁻ layer 102 at a constant distance. Further, a gate electrode 108 is formed through an oxide film 107. In this manner, a p channel MOS transistor for resetting (hereinafter, referred to as a reset Tr) is constituted. The reset Tr may be obviously replaced by an n channel MOS transistor.

An insulative film 109 is formed on the bipolar transistor and reset Tr. An electrode 110 joined to the p+ region 106 and an emitter electrode 111 joined to the n+ emitter region 104 are formed, respectively. Further, an insulative film 112 is formed on the insulative film 109. The portion excluding the opening portion is covered by a light shielding film 113. The light shielding film 113 is formed over the cells $S_d$ and $S_f$, thereby constituting the light shielding portion. The other cells $S_1$ to $S_n$ constitute the opening portion.

On the other hand, a collector electrode 114 is formed on the back surface of the substrate 101.

In this apparatus, the incident light is converted into electric signals by the cells $S_1$ to $S_n$. A dark reference signal for dark output compensation is derived from the cell $S_d$. The inflow of the excess carriers to the dark reference cell $S_d$ is blocked by the cell $S_f$ formed between the opening portion and the cell $S_d$.

The p base region 103 in the excess carrier eliminating cell $S_f$ in the embodiment is fixed to a potential $V_{fx}$ of a collector potential $V_{cc}$ or less. Therefore, even if the excess holes accumulated in the p base region 103 of the cells $S_1$ to $S_n$ overflowed, they are attracted to the p base region 103 of the cell $S_f$ and do not reach the dark reference cell $S_d$. Namely, even if the strong light had entered the photoelectric converting cells in the opening portion and the excess carriers flowed out from the p base region 103 to the collector side, the correct dark reference output can be always obtained from the dark reference cell $S_d$.

Further, in the embodiment, since the excess carrier eliminating cell $S_f$ has the same constitution as those of the other cells, any special manufacturing process is unnecessary to form the cell $S_f$. On the other hand, since the cells of the same constitution are arranged, this embodiment is also advantageous with respect to noise.

Although the case of the photoelectric converting cell using the npn type bipolar transistor has been described in the embodiment, the invention can be obviously easily applied to a photoelectric converting cell using a field effect transistor, an electrostatic induction transistor, or the like which has a region to accumulate the carriers.

The operation of the photoelectric converting cell in the embodiment will now be explained.

Figure 5A:
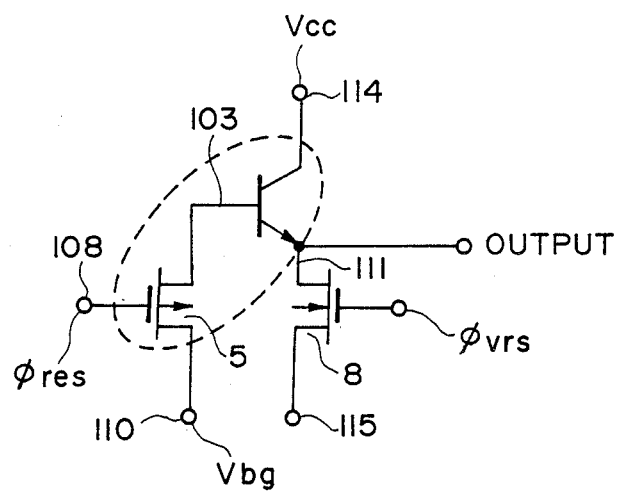
FIG. 5A is an equivalent circuit diagram for explaining the fundamental operation of the photoelectric converting cell.
Figure 5B:
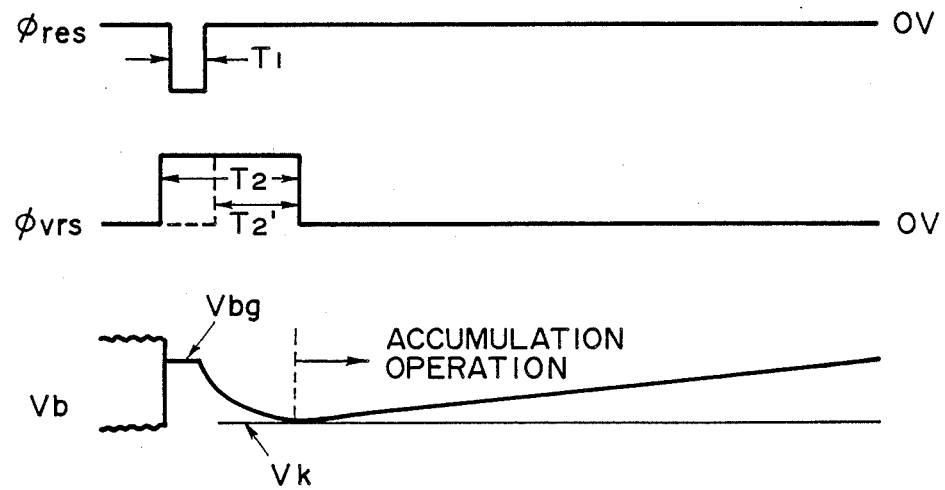
FIG. 5B is a voltage waveform diagram showing the operation of the circuit of FIG. 5A.

FIG. 5A is an equivalent circuit diagram for explaining the fundamental operation of the foregoing photoelectric converting cell. FIG. 5B is a voltage waveform diagram showing the operation of the circuit of FIG. 5A.

In FIG. 5A, the photoelectric converting cell is equivalent to a circuit in which the p base region 103 of the npn type bipolar transistor 1 is connected to a drain of a reset Tr 5.

A pulse $\phi_{res}$ is input to the gate electrode 108 of the reset Tr 5. A constant voltage $V_{bg}$ (e.g., 2 V) is properly applied to the source electrode 110 of the reset Tr 5. The emitter electrode 111 is connected to a terminal 115 through an n channel MOS transistor 8. A pulse $\phi_{vrs}$ is input to a gate electrode of the transistor 8. A voltage which is sufficiently lower than the voltage $V_{bg}$ or an earth voltage is properly applied to the terminal 115.

First, in the accumulation operation, a potential $V_b$ of the p base region 103 is set into a floating state at an initial positive potential and the emitter region 104 is set into a floating state at the zero potential, respectively. The positive voltage $V_{cc}$ is applied to the collector electrode 114. On the other hand, the gate electrode 108 of the reset Tr 5 is set to a positive potential. The reset Tr 5 is set to the OFF state.

When the light enters the photo sensitive portion in this state, carriers (in this case, holes) as many as the light quantity are accumulated in the p base region 103.

At this time, since the p base region 103 is set to the initial positive potential, when the carriers are accumulated by light excitation, the signal corresponding to the accumulated carriers is simultaneously read out to the emitter side in the floating state, so that a photoelectric conversion output is obtained. Namely, in this embodiment, the reading operation is executed simultaneously with the accumulation operation.

The operation to extinguish the carriers accumulated in the p base region 103 will now be described.

As shown in FIG. 5B, since the pulse $\phi_{res}$ of negative voltage is first applied to the gate electrode 108 of the reset Tr 5, the reset Tr 5 is turned on (for a period of time $T_1$). Thus, the potential $V_b$ of the p base region 103 is set to the constant voltage $V_{bg}$ irrespective of the voltage which has been accumulated so far, i.e., independently of the illumination of the incident light.

The constant voltage $V_{bg}$ is set to a value which is sufficiently higher than a base residual potential $V_k$ after completion of the carrier extinguishing operation. For example, $V_{bg} = 2$ V.

Next, the transistor 8 is turned on by the pulse $\phi_{vrs}$ of a positive voltage. The earth voltage at the terminal 115 or a voltage sufficiently lower than $V_{bg}$ is applied to the emitter electrode 111 through the transistor 8 (for a period of time $T_2'$). The pulse $\phi_{vrs}$ of a positive voltage can be also obviously applied continuously after the leading edge of the pulse $\phi_{res}$ (for a period of time $T_2$).

Thus, the holes accumulated in the p base region 103 are recombined with the electrons injected from the n+ emitter region 104 into the p base region 103, so that the holes are extinguished. As already mentioned above, the potential $V_b$ of the p base region 103 is set to the potential $V_{bg}$ which is sufficiently higher than the residual potential $V_k$ irrespective of the accumulated potential for the period of time $T_1$. Therefore, after the elapse of the period of time $T_2$ or $T_2'$, the potential $V_b$ of the p base region 103 is set to the constant potential $V_k$ independently of the intensity of the illumination.

On the other hand, after completion of the period of time $T_2 T_2'$, the pulse $\phi_{vrs}$ trails to turn off the transistor 8, so that the emitter electrode 111 is set into the floating state. The operation mode enters the foregoing accumulation or readout operation.

As mentioned above, by providing the period of time $T_1$ when the potential of the p base region 103 is set to the constant potential, at the end of the extinguishing operation for the period of time $T_2$ or $T_2'$, the potential $V_b$ of the p base region 103 can be set to the constant value. Therefore, the non-linearity of the photoelectric converting characteristics and the after image phenomenon when the illumination is low can be completely prevented. On the other hand, since the potential of the p base region 103 is not controlled by the capacitor, reduction and variation in output due to the capacitor do not occur.

Figure 6:
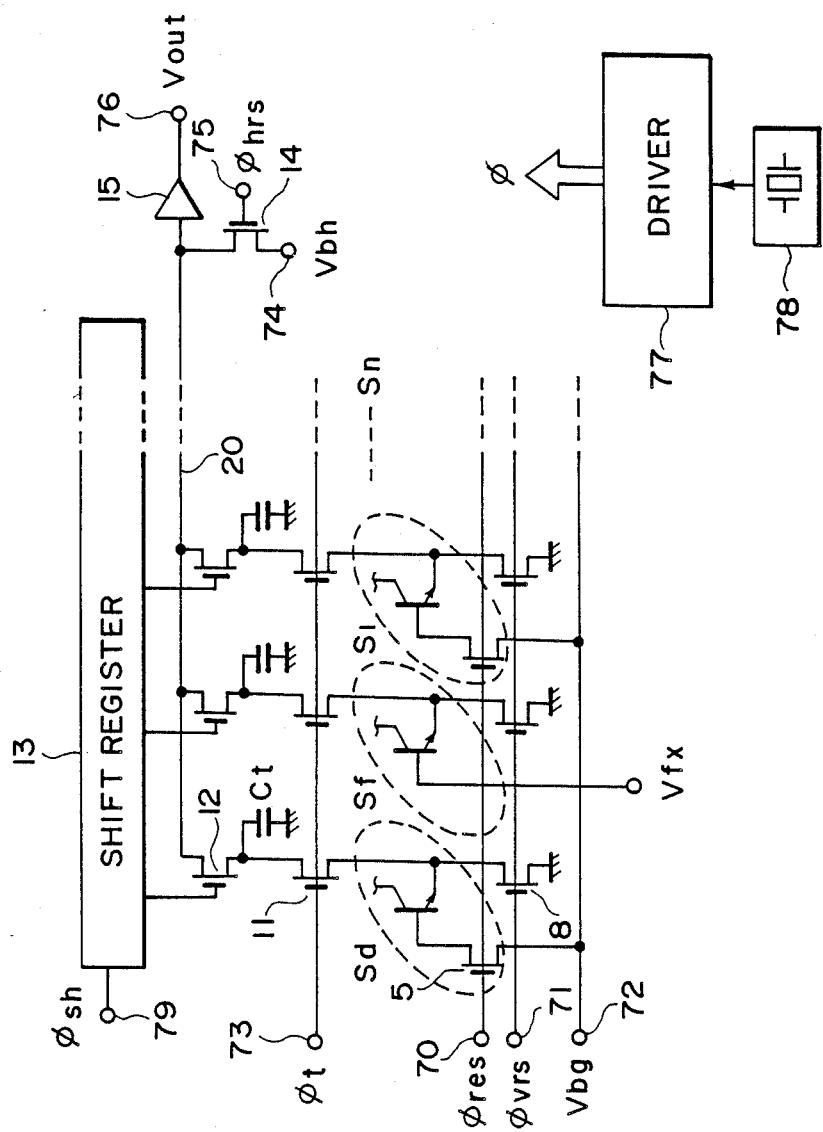
FIG. 6 is a schematic circuit diagram of an embodiment using the photoelectric converting cells.

FIG. 6 is a schematic circuit diagram of the embodiment using the foregoing photoelectric converting cells.

The cells $S_d$, $S_f$, and $S_1$ to $S_n$ in the embodiment are arranged in a line as shown in FIG. 3.

In FIG. 6, the gate electrode 108 of the reset Tr 5 of each cell is commonly connected to a terminal 70. A pulse $\phi_{res}$ is input to the terminal 70. On the other hand, the source electrodes 110 are commonly connected to a terminal 72. The voltage $V_{bg}$ is applied to the terminal 72.

However, the potential of the p base region 103 of the excess carrier eliminating cell $S_f$ is fixed to $V_{fx}$. For this purpose, the reset Tr 5 is always held in the ON state and the voltage $V_{fx}$ is applied to the source electrode 110. Or, an electrode is directly connected to the p base region 103 and the voltage $V_{fx}$ is applied to this electrode.

The emitter electrodes 111 of the respective cells are connected to ground through the transistor 8. The gate electrodes of the transistors 8 are commonly connected to the terminal 71. The pulse $\phi_{vrs}$ is input to the terminal 71.

Further, the emitter electrode 111 of each cell is connected to a capacitor $C_t$ for accumulation through a transistor 11. Each capacitor $C_t$ is commonly connected to an output line 20 through each transistor 12.

A gate electrode of each transistor 11 is commonly connected to a terminal 73. A pulse $\phi_t$ is input to the terminal 73.

A gate electrode of the transistor 12 is connected to an output terminal of a shift register 13. The transistors 12 are sequentially turned on by the shift register 13. The shift register 13 is made operative by a shift pulse $\phi_{sh}$ which is input from a terminal 79 and the high level position is successively shifted.

The output line 20 is connected to an output terminal 76 through an output amplifier 15. An input of the output amplifier 15 is connected to a terminal 74 through a transistor 14. The constant voltage $V_{bh}$ is applied to the terminal 74. On the other hand, a pulse $\phi_{hrs}$ is input to a gate electode 75 of the transistor 14.

Each of the foregoing pulses $\phi$, and the constant voltages $V_{bg}$, $V_{fx}$, and $V_{bh}$ are supplied from a driver 77. The driver 77 outputs each pulse at the timing responsive to a clock signal from an oscillator 78.

The operation of the embodiment will now be described hereinbelow with reference to FIG. 7.

Figure 7:
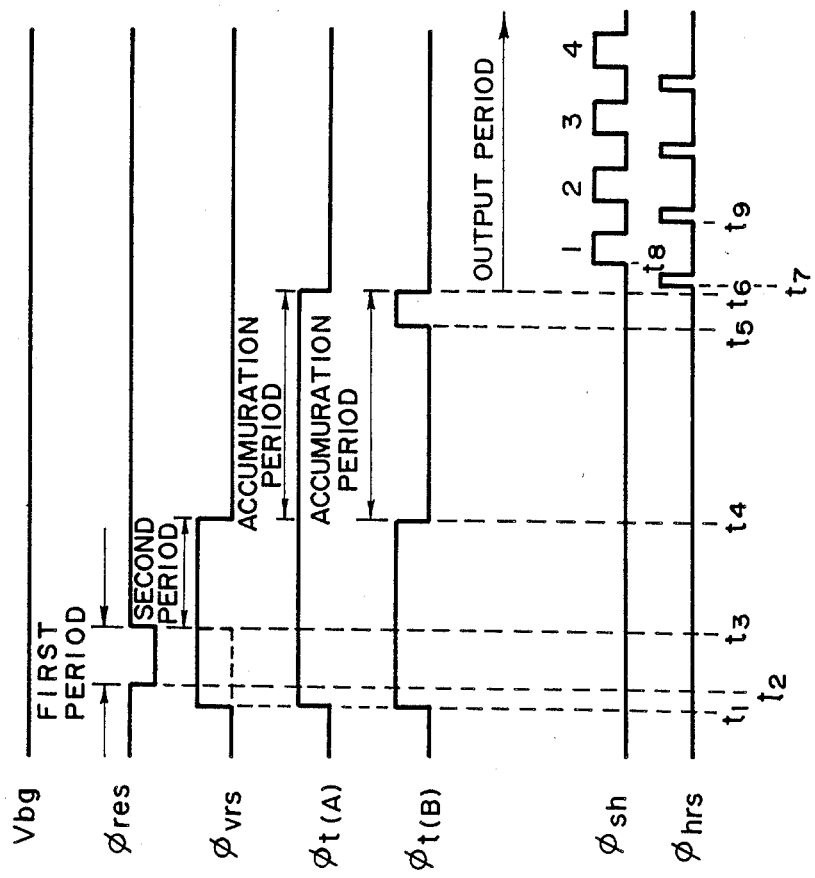
FIG. 7 is a timing chart showing an example of timings for respective pulses which are output from a driver 77.

FIG. 7 is a timing chart showing an example for the timings of the respective pulses which are output from the driver 77.

In FIG. 7, $\phi_{t(A)}$ and $\phi_{t(B)}$ represent timings for different reading methods.

The case of $\phi_{t(A)}$ will be first described.

By setting the pulse $\phi_{res}$ to the low level at time $t_2$ after the pulses $\phi_t$ and $\phi_{vrs}$ were set to the high level at time $t_1$, all of the reset Tr 5 (in this case, the p channel MOS transistors) are turned on, thereby setting the potential of the p base region 103 of each cell to the constant potential $V_{bg}$.

On the other hand, since $\phi_t$ is at the high level, the transistor 11 is in the ON state and the charges in the capacitor $C_t$ are eliminated through the transistors 11 and 8.

When the pulse $\phi_{res}$ then trails at time $t_3$, since the pulse $\phi_{vrs}$ is still held at the high level, the carriers accumulated in the base are gradually recombined and extinguished as already mentioned above. The amount of residual carriers in the base at time $t_4$ in each cell is always equal excluding the cell $S_f$ irrespective of the amount of carriers which have remained so far in the base before time $t_2$.

When $\phi_{vrs}$ falls at time $t_4$, the emitter electrode 111 of each cell is connected to the capacitor $C_t$ through the transistor 11. The foregoing accumulation and readout operations are executed until $\phi_t$ falls at time $t_6$. Namely, as the carriers excited by the light in the cells $S_1$ to $S_n$ are accumulated in the base, the carriers corresponding to the accumulated amount are then accumulated into the capacitors $C_t$, respectively. At this time, even if the excess carriers flowed out from the base to the collector side by the strong light, they are attracted to the p base region of the excess carrier eliminating cell $S_f$ and do not reach the dark reference cell $S_d$.

When $\phi_t$ trails at time $t_6$, the transistors 11 are turned off and the signals photoelectrically converted in the cells $S_1$ to $S_n$ and the dark reference signal of the dark reference cell $S_d$ are accumulated and stored into the capacitors $C_t$, respectively. Although the output from the cell $S_f$ is also accumulated into the capacitors $C_t$, this output is ignored at the post stage in this embodiment.

Next, the operations to sequentially take out the information accumulated in the capacitors $C_t$ and to serially output them are executed.

First, by applying one pulse $\phi_{hrs}$ at time $t_7$, the transistor 14 is turned on, thereby eliminating the charges remaining in the stray capacitance of the output line 20.

Subsequently, by applying one pulse $\phi_{sh}$ at time $t_8$, the scan of each transistor 12 by the shift register 13 is started.

When one transistor 12 is turned on, the charges accumulated in the capacitor $C_t$ corresponding to this transistor are taken out to the output line 20 and output from the output terminal 76 to the outside through the amplifier 15. Immediately after that, the transistor 14 is turned on by $\phi_{hrs}$ and the output line 20 is cleared.

The above-mentioned signal take-out operations are successively executed at the timings of the shift pulses $\phi_{sh}$ with respect to the cells $S_d$ to $S_n$. The signals photoelectrically converted for the time interval from time $t_4$ to time $t_6$ and the dark reference signal can be sequentially output.

After all of the signals accumulated in the capacitors $C_t$ were taken out, the carrier extinguishing operation for the period of time from $t_1$ to $t_4$, the accumulation and readout operations for the period of time from $t_4$ to $t_6$, and the signal take-out operation after time $t_7$ are again repeated in this order.

The readout operations in the case of $\phi_{t(B)}$ are further improved operations of those in case of $\phi_{t(A)}$.

Namely, $\phi_t$ is set to low level for the period of time from $t_4$ to $t_5$. Thus, the carriers generated in base of each cell due to the light excitation are accumulated into each cell without being accumulated into the capacitor $C_t$. The signals which were accumulated in the cells by $\phi_t$ for the period of time from $t_5$ to $t_6$ are respectively transferred to the capacitors $C_t$. According to this method, it has been confirmed by experiments that the output level was improved by 20 to 30% and the variation in sensitivity was also remarkably reduced as compared with those in the case of $\phi_{t(A)}$.

On the other hand, although $\phi_{vrs}$ has been set to the high level for the period of time from $t_1$ to $t_3$, it can be also set to the low level. In such a case, there are effects such that the current flowing between the base and the emitter of the cell can be cut out for the period of time from $t_1$ to $t_3$ and the loss of electric power consumption is prevented.

In this manner, each signal of the cells $S_d$, $S_f$, and $S_1$ to $S_n$ is serially output as an output signal $V_{out}$ from the terminal 76 of the amplifier 15 to the outside. The noise components by the dark current are eliminated by the dark output compensation section 3 described in FIG. 1. In this case, the output of the cell $S_f$ is ignored in the dark output compensation section 3.

Although the case of the line sensor has been described in the above embodiment, the same shall also apply to an area sensor. It is sufficient to use a constitution in which a plurality of line sensor sections are arranged.

As explained in detail above, in the photoelectric converting apparatus according to the first embodiment of the invention, by providing the carrier eliminating means between the opening portion and the light shielding portion, the leakage of the photosignals from the opening portion is blocked and an output which is not adversely influenced by the light from the sensor in the light shielding portion can be obtained.

Therefore, for example, the correct dark reference signal can be obtained from the sensor in the light shielding portion. The accurate dark output compensation of the photoelectric conversion output, peak detection output, or the like can be executed.

Figure 8:
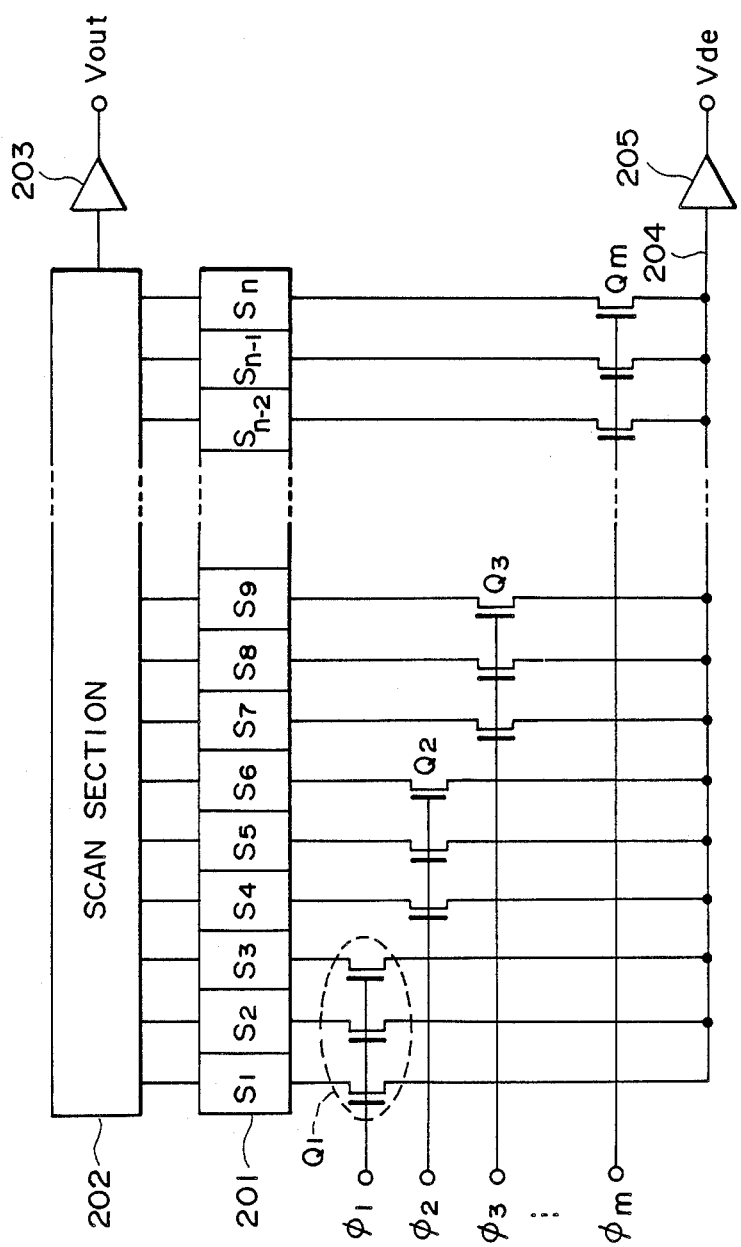
FIG. 8 is a schematic circuit diagram in the second embodiment of a photoelectric converting apparatus according to the invention.

FIG. 8 is a schematic circuit diagram in the second embodiment of the photosensors $S_1$ to $S_n$ in the photoelectric converting apparatus shown in FIGS. 1 to 7 according to the invention.

Figure 1:
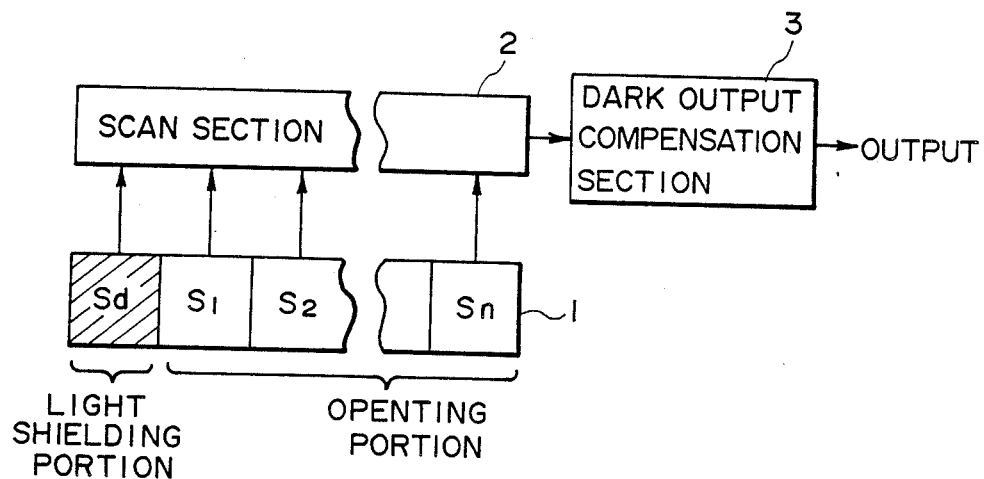
FIG. 1 is a schematic constitutional diagram of a conventional photoelectric converting apparatus having the dark output compensating function.
Figure 2:
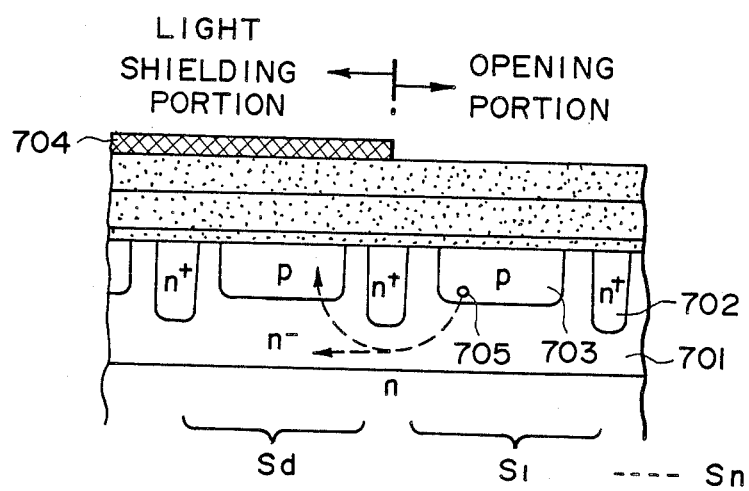
FIG. 2 is a schematic cross sectional view of a sensor section 1 in the above conventional apparatus.

In the diagram, a sensor section 201 is constituted by arranging a plurality of photosensors in a line or an area as shown in FIG. 1. In this example, the sensor section 201 comprises the n photosensors $S_1$ to $S_n$ arranged in a line. The light shielded photocells $S_d$ and $S_f$ are not shown. It is desirable that a photosensor having two or more output terminals of the readout signal is used.

The readout signals of the photosensors are sequentially taken out by a scan section 202 and output as signals $V_{out}$ to the outside through an amplifier 203.

On the other hand, to detect the peak value or mean value of the readout signals, the output terminals of the sensors are connected to a common line 204 through switching transistors. Every three gate electrodes of the switching transistors are commonly connected. Transistor groups $Q_1$ to $Q_m$ are constituted as examples of selecting means. It is obviously possible to constitute the transistor groups by commonly connecting a desired number of gate electrodes.

The gate electrodes of each of the transistor groups $Q_1$ to $Q_m$ are commonly connected, respectively. By inputting selection pulses $\phi_1$ to $\phi_m$, each transistor group is turned on or off.

A detection signal of the peak value, mean value, or the like appearing on the common line 204 is transmitted through an amplifier 205 and output as a signal $V_{de}$ to a gain control circuit or the like.

With this constitution, a desired transistor group can be turned on by the selection pulses $\phi_1$ to $\phi_m$ and the photosensors in a desired portion can be used to measure the light. For example, by setting the pulses $\phi_1$ and $\phi_2$ to the high level to turn on only the transistor groups $Q_1$ and $Q_2$, the peak vale or mean value can be detected by the readout signals of the photosensors $S_1$ to $S_6$.

The sensor section 201 in the embodiment is not limited to the line sensor. The invention can be also similarly applied to an area sensor with a constitution such that a plurality of line sensors are arranged. In this case, each section of the photosensors $S_1$ to $S_n$ in the sensor section 201 corresponds to each column in the area and comprises a plurality of photosensors.

A practical example of the photosensors is shown and the third embodiment using these photosensors will now be described.

First, a structure of the photoelectric converting cells which are used in this embodiment and the fundamental operation will be explained.

Figure 9:
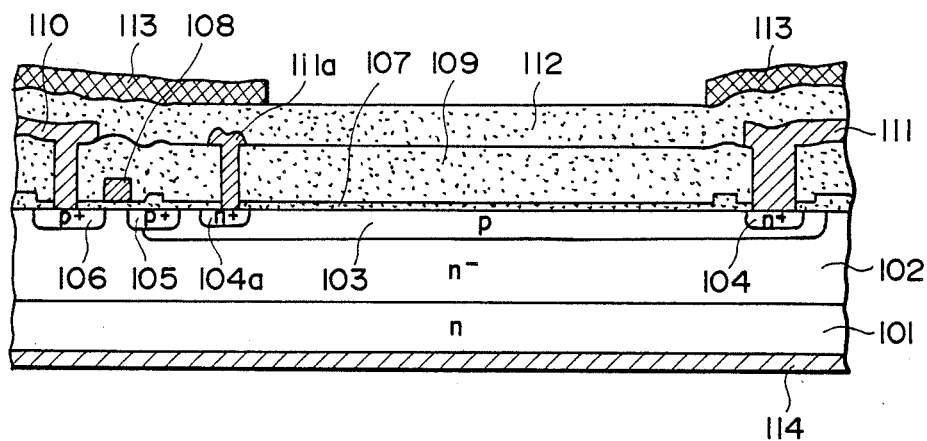
FIG. 9 is a schematic cross sectional view of an example of a photoelectric converting cell.

FIG. 9 is a schematic cross sectional view of an example of the photoelectric converting cells.

In the diagram, the same parts and components as those shown in FIG. 4 are designated by the same reference numerals.

The n+ emitter region 104 and an n+ emitter region 104a are formed in the p base region 103, thereby constituting an npn type bipolar transistor of a double emitter structure. An emitter electrode 111a is formed in correspondence with the emitter region 104a.

Although the case of the photoelectric converting cell using the npn type bipolar transistor has been shown, the photoelectric converting cell can also use a field effect transistor or an electrostatic induction transistor or the like.

Figure 10:
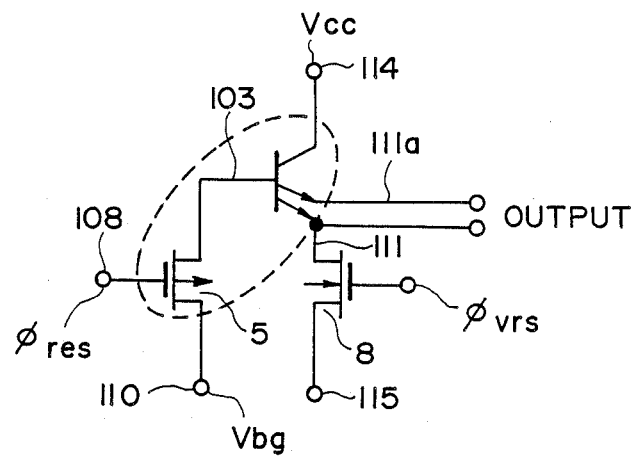
FIG. 10 is an equivalent circuit diagram for explaining the fundamental operation of the photoelectric converting cell.

FIG. 10 is an equivalent circuit diagram for explaining the fundamental operation of the foregoing photoelectric converting cell and differs from FIG. 5A with respect to only a point that the cell in FIG. 10 has the emitter electrode 111a. The drive voltages are similar to those in FIG. 5B.

Figure 11:
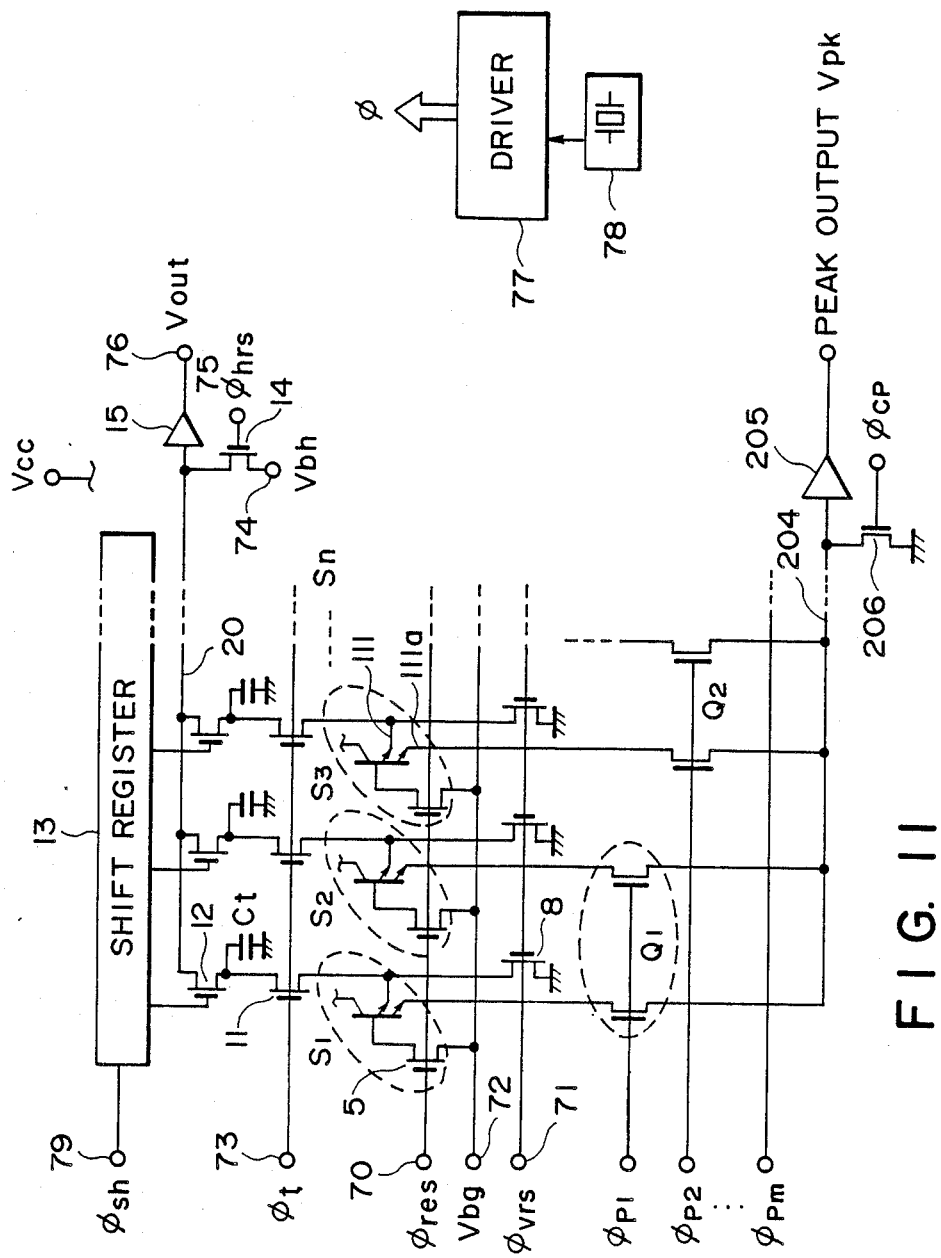
FIG. 11 is a schematic circuit diagram in the third embodiment of the invention using the photoelectric converting cells.

FIG. 11 is a schematic circuit diagram in the third embodiment of the invention using the foregoing photoelectric converting cells and the same parts and components as those shown in FIG. 6 are designated by the same reference numerals.

The emitter electrodes 111a of the cells are connected to the common line 204 through the transistor groups $Q_1$ to $Q_m$ each consisting of two transistors. Selection pulses $\phi_{p1}$ to $\phi_{pm}$ are input to the gate electrodes of the transistor groups, thereby turning on or off each transistor group.

On the other hand, the common line 204 is connected to the input terminal of the amplifier 205 and is also connected to the ground through a transistor 206 for resetting. A pulse $\phi_{cp}$ is input to the transistor 206.

The operation in this embodiment will be described hereinbelow with reference to FIG. 12.

FIG. 12 is a timing chart showing an example of the timings for the respective pulses which are output from the driver 77. In this example, the case where the cells $S_1$ and $S_2$ were selected for peak detection will be described. As explained hereinafter, the cells can be easily selected by the selection pulses $\phi_{p1}$ to $\phi_{pm}$.

In FIG. 12, $\phi_{t(A)}$ and $\phi_{t(B)}$ denote the timings for the different reading methods, respectively.

The case of $\phi_{t(A)}$ will be first described.

By setting $\phi_{res}$ to the low level at time $t_2$ after the pulses $\phi_t$ and $\phi_{vrs}$ and selection pulses $\phi_{p1}$ to $\phi_{pn}$ were set to the high level at time $t_1$, all of the reset Tr 5 are turned on, thereby setting the potential of the p base region 103 of each cell to the constant potential $V_{bg}$.

On the other hand, since the $\phi_t$ is at the high level, the transistor 11 is in the ON state. The charges in the capacitor $C_t$ are eliminated through the transistors 11 and 8.

Further, since the transistor groups $Q_1$ to $Q_m$ and transistor 206 are turned on, the charges on the common line 204 are eliminated.

Next, when the $\phi_{res}$ falls at time $t_3$, since $\phi_{vrs}$ and $\phi_{p1}$ to $\phi_{pm}$ and $\phi_{cp}$ are still at the high level, the carriers accumulated in the base are gradually recombined and extinguished as already mentioned above. The amount of carriers remaining in the base at time $t_4$ is always equal with respect to all of the cells irrespective of the amount of carriers which have remained in the base before time $t_2$.

Next, since the cells $S_1$ and $S_2$ are designated as the sensors for peak detection, the selection pulse $\phi_{p1}$ is held at the high level and $\phi_{vrs}$, $\phi_{p2}$ to $\phi_{pm}$, and $\phi_{cp}$ are set to the low level at time $t_4$. Thus, the emitter electrode 111 of each cell is connected to the capacitor $C_t$ through the transistor 11 and at the same time, only the emitter electrodes 111a of the selected cells $S_1$ and $S_2$ are connected to the common line 204 through the transistor group $Q_1$.

The foregoing accumulation and readout operations are executed until $\phi_t$ falls at time $t_6$. Namely, as the carriers generated in the cells $S_1$ to $S_n$ by light excitation are accumulated in the base, carriers as many as the accumulated amount are accumulated into the capacitors $C_t$, respectively.

At the same time, the peak value of the readout signals of the cells $S_1$ and $S_2$ appears on the common line 204 and is output as a peak output $V_{pk}$ through the amplifier 205. The peak output $V_{pk}$ is input to the gain control circuit and used to adjust the gain when the output signal $V_{out}$ is processed. The peak output $V_{pk}$ is also input to a control circuit and used to adjust the accumulation periods of the cells $S_1$ to $S_n$.

When $\phi_t$ and $\phi_{p1}$ fall at time $t_6$, the transistors 11 are turned off and the signals photoelectrically converted by the cells $S_1$ to $S_n$ are accumulated and stored in the capacitors $C_t$, respectively.

Next, the operations to sequentially take out the information accumulated in the capacitors $C_t$ and to serially output them are executed.

First, by applying one pulse $\phi_{hrs}$ at time $t_7$, the transistor 14 is turned on, thereby eliminating the charges remaining in the stray capacitance of the output line 20.

Subsequently, by applying one pulse $\phi_{sh}$ at time $t_8$, the scan of each transistor 12 by the shift register 13 is started.

When one transistor 12 is turned on, the charges accumulated in the corresponding capacitor $C_t$ are taken out to the output line 20 and output from the output terminal 76 to the outside through the amplifier 15. Immediately after that, the transistor 14 is turned on by $\phi_{hrs}$ and the output line 20 is cleared.

The foregoing signal take-out operations are sequentially executed at the timings of the shift pulses $\phi_{sh}$ with respect to the cells $S_1$ to $S_n$. The signals photoelectrically converted for the time interval from $t_4$ to $t_6$ are successively output as the output signals $V_{out}$ to the outside.

After all of the signals accumulated in the capacitors $C_t$ were taken out, the carrier extinguishing operation for the period of time from $t_1$ to $t_4$, the accumulation, readout, and peak value detecting operations for the period of time from $t_4$ to $t_6$, and the signal take-out operation after time $t_7$ are again repeated in accordance with this order.

In this embodiment, the peak value can be detected in a real time manner by use of the readout signals of the cells which were arbitrarily selected. On the other hand, each time the output operation was finished, the cells can be also easily selected by the selection pulses $\phi_{p1}$ to $\phi_{pm}$.

The readout operations in case of the $\phi_{t(B)}$ are the further improved operations of those in the case of $\phi_{t(A)}$ and are substantially similar to those described in the timing chart shown in FIG. 7. Therefore, their detailed descriptions are omitted.

The signals of the cells $S_1$ to $S_n$ are serially output as the output signals $V_{out}$ from the terminal 76 of the amplifier 15 to the outside.

Even in the case of constituting an area sensor, it is sufficient to perform the foregoing operations in the case of the line sensor by the vertical scan every line and constitutions of the transistor groups and the like are similar to that in this embodiment.

Although the case of the peak value detection has been described in this embodiment, in the case of detecting the mean value, it is sufficient to add a capacitor for accumulation to the emitter electrode 111a of each cell and to turn on the transistor group designated by the selection pulses $\phi_{p1}$ to $\phi_{pm}$ after completion of the accumulation period. With this constitution, the mean value of the readout signals from the selected cells appears on the common line 204.

As described in detail above, in the photoelectric converting apparatus according to the second and third embodiment of the invention, by providing the selecting means which can select the photosensors in a desired portion, the sensor section to perform the light measurement such as peak value detection, mean value detection, or the like can be arbitrarily switched. The optimum peak value, mean value, or the like adapted to process the readout signals can be derived.

The fourth embodiment of the invention constituted such that the smear can be further effectively prevented will now be described in detail hereinbelow with reference to the drawings.

Figure 13:
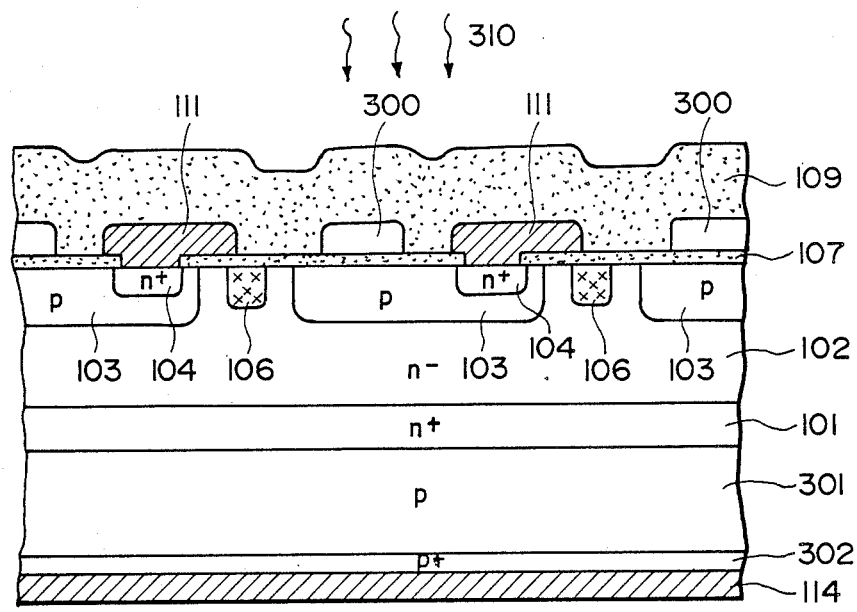
FIG. 13 is a schematic cross sectional view showing a constitution in the fourth embodiment of a photoelectric converting apparatus according to the invention.

FIG. 13 is a schematic cross sectional view showing a constitution of the fourth embodiment of the substrate portions of the photoelectric converting apparatuses shown in FIGS. 1 to 12 according to the invention.

In the diagram, an n+ buried layer 101 is formed on a p substrate 301. An n− region 102, n+ device separating regions 106, p base regions 103, and n+ emitter regions 104 are respectively formed over the n+ buried layer 101. Further, capacitor electrodes 300 made of polysilicone or the like and emitter electrodes 111 made of aluminum or the like are formed through the oxide film 107.

The electrode 114 is formed on the back surface of the p substrate 301 through a p+ layer 302.

In this embodiment, the electrode 114 is set to a negative voltage (e.g., −5 V). By applying a voltage to the n+ buried layer 101 and n+ device separating regions 106, the n− region 102 as the collector region is set to the positive voltage $V_{cc}$.

Thus, the PN junction between the n+ buried layer 101 and the p substrate 301 is reversely biased and a depletion layer is formed mainly in the p substrate 301 side. Therefore, the holes generated in the p substrate 301 are eliminated from the electrode 114 without flowing out to the adjacent pixel.

On the other hand, even if strong light had entered and the holes overflowed from the p base region 103, the outflow of the holes is suppressed by the n+ device separating regions 106 and at the same time, the holes are attracted to the p substrate 301 side, so that the leakage to the adjacent pixel is prevented.

The fundamental operation of this photoelectric converting cell is fundamentally the same as those in the embodiments shown in FIGS. 1 to 12. First, the p base region 103 biased to the negative voltage is set into the floating state and the holes in the electron/hole pairs excited and generated by an incident light 310 are accumulated into the p base region 103 (accumulation operation).

Subsequently, by applying the positive voltage to the capacitor electrode 300, the base potential is raised and the circuit between the emitter and the base is forwardly biased, thereby reading out the accumulated voltage generated by the accumulated holes to the emitter side in the floating state (readout operation).

Subsequently, the emitter side is grounded and the pulse of the positive voltage is applied to the capacitor electrode 300, thereby extinguishing the holes accumulated in the p base regions 103. Thus, the p base region 103 is reset to the initial state in response to the trailing edge of the positive voltage pulse to refresh (refreshing operation).

The foregoing photoelectric converting apparatuses shown in FIGS. 1 to 13 amplify the accumulated charges by the amplifying function of each cell and then are read. Therefore, high output, high sensitivity, and low noise can be accomplished. In addition, since the structure is simple, these apparatuses are also advantageous to realize a high resolution in the future. Moreover, there is a large effect to prevent smear because the semiconductor substrate of another conductivity type is formed on the collector side as explained in the constitution shown in FIG. 13.

Figure 14:
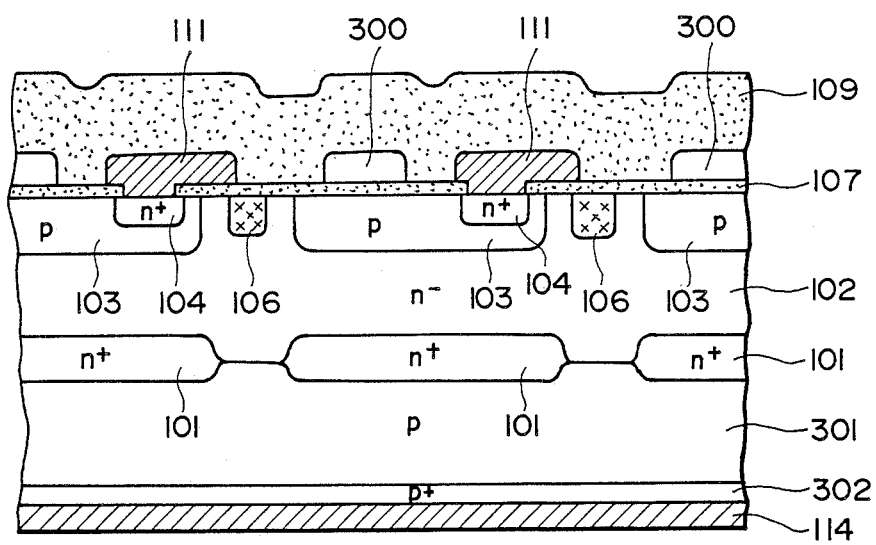
FIG. 14 is a schematic cross sectional view showing a constitution in the fifth embodiment of the invention.

FIG. 14 is a schematic cross sectional view showing the constitution in a fifth embodiment of the invention.

In this embodiment, since the n+ buried layers 101 are formed excluding the portions below the n+ device separating regions 106, large depletion layers are also formed on the side of the n− region 102 below the device separating regions 106.

Therefore, not only the holes generated in the p substrate 301 but also the holes overflowed from the p base region 103 can be effectively eliminated to the p substrate 301 side, so that the smear can be more effectively prevented.

In each of the foregoing embodiments, the photoelectric converting cells of the base accumulation type have been used. However, the invention can be also applied to cells of other type such as a static induction type or the like which can accumulate the photo charges.

In the image pick-up apparatus using the foregoing embodiments, by providing a PN junction on the collector side, the outflow of unnecessary carriers or the like to the adjacent pixel can be prevented. Thus, smear can be suppressed and high picture quality can be obtained.

The invention can be also similarly applied to an area sensor as well as the line sensor.

What is claimed is:

1. A photoelectric converting apparatus comprising:
   a plurality of photosensors divided into an opening portion and a light shielding portion; and
   means for biasing at least one photosensor provided between the photosensors in said light shielding portion and the photosensors in the opening portion to prevent a flow of photosignals from said opening portion to said light shielding portion.

2. An apparatus according to claim 1, wherein each of said photosensors comprises a photoelectric converting transistor having a control electrode region to accumulate carriers generated by a light excitation, and wherein a potential of said control electrode region is set to a constant potential so as to attract carriers from said opening portion.

3. An apparatus according to claim 1, further comprising means for shielding the biased photosensor from light.

4. An apparatus according to claim 1, further comprising means for eliminating an output of a photosensor in said light shielding portion from outputs of the photosensors in said opening portion.

5. A photoelectric converting apparatus comprising:
   light measuring means including a plurality of phototransistors having plural emitters; and
   selecting means for selecting the emitters in a desired portion among said plurality of phototransistors to provide a photometric signal formed by the selected emitters.

6. An apparatus according to claim 5, wherein each of said phototransistors includes a photoelectric converting transistor having a control electrode region to accumulate carriers generated by the light excitation and a plurality of main electrode regions.

7. An apparatus according to claim 6, wherein said selecting means forms the photometric signal by selectively using the signal of one of the main electrode regions of each of said phototransistors.

8. An apparatus according to claim 7, wherein said main electrode region which is used by said selecting means constitutes an emitter.

9. An apparatus according to claim 8, wherein said selecting means includes a switching element.

10. An apparatus according to claim 9, wherein said selecting means connects emitters of predetermined phototransistor cells to a common output line.

11. An apparatus according to claim 5, wherein a portion of said plurality of phototransistors is shielded from light.

12. An apparatus according to claim 11, further comprising carrier eliminating means for preventing the movement of carriers between the light shielded phototransistors and the phototransistors which are not shielded from light.

13. An apparatus according to claim 12, wherein each of said phototransistors comprises a photoelectric converting transistor having a control electrode region to accumulate carriers generated by light excitation, and wherein said carrier eliminating means has the same constitution as said phototransistors, and wherein a potential of said control electrode region is fixed to a constant potential so as to attract the carriers from the phototransistors which are not shielded from light.

14. A photoelectric converting apparatus comprising:
   a plurality of photosensors each having an accumulation region of a semiconductor of one conductivity type to accumulate carriers generated by light excitation, said light excitation being caused by light impinging from one side of said accumulation region; and
   a first region of a semiconductor of an opposite conductivity type joined to said accumulation region and a second region of a semiconductor of said one conductivity type joined to said first region provided on the other side of said accumulation region.

15. An apparatus according to claim 14, wherein in a joined portion of said first and second regions, at least a portion below said accumulation region is formed so as to have a high impurity concentration.

16. An apparatus according to claim 14, further comprising means for reversely biasing said first and second regions.

17. An apparatus according to claim 14, wherein a portion of said plurality of photosensors is shielded from light.

18. An apparatus according to claim 17, further comprising carrier elimination means for preventing the movement of carriers between the light shielded photosensors and the photosensors which are not shielded from the light.

19. An apparatus according to claim 18, wherein each of said photosensors comprises a photoelectric converting transistor having a control electrode region to accumulate carriers generated by light excitation, and wherein said carrier eliminating means has the same constitution as said photosensors, and wherein a potential of said control electrode region is fixed to a constant potential so as to attract the carriers from the photosensors which are not shielded from light.

20. An apparatus according to claim 14, further comprising selecting means for selecting the photosensors in a desired portion among said plurality of photosensors, said control means for forming a photometric signal from said selected photosensors.

21. An apparatus according to claim 20, wherein each of said photosensors includes a photoelectric converting transistor having a control electrode region to accumulate carriers generated by light excitation, and a plurality of main electrode regions.

22. An apparatus according to claim 21, wherein said selecting means forms the photometric signal by selectively using the signal of one of the main electrode regions of each of said photosensors.

23. An apparatus according to claim 22, wherein said main electrode region which is used by said selecting means comprises an emitter.

24. An apparatus according to claim 23, wherein said selecting means includes a switching element.

* * * * *

UNITED STATES PATENT AND TRADEMARK OFFICE
CERTIFICATE OF CORRECTION

PATENT NO. : 4,879,470
DATED : November 7, 1989
INVENTOR(S) : Sugawa, et al.

It is certified that error appears in the above-identified patent and that said Letters Patent is hereby corrected as shown below:

ON THE TITLE PAGE,
[57] ABSTRACT:

Line 7, "of" should be deleted.

FIG. 1 (Sheet 1):

"OPENTING PORTION" should read --OPENING PORTION--.

FIG. 7 (Sheet 5):

"ACCUMURATION PERIOD" (both occurrences) should read --ACCUMULATION PERIOD--.

FIG. 12 (Sheet 9):

"ACCUMURATION PERIOD" (both occurrences) should read --ACCUMULATION PERIOD--.

COLUMN 5:

Line 62, "time $T_2$ $T_2'$," should read --time $T_2$ or $T_2'$,--.

COLUMN 10:

Line 44, "$\phi_t$ and $\phi p1$ fall at time t6," should read --$\phi_t$ and $\phi_{p1}$ fall at time $t_6$,--.

UNITED STATES PATENT AND TRADEMARK OFFICE
CERTIFICATE OF CORRECTION

PATENT NO. : 4,879,470

DATED : November 7, 1989

INVENTOR(S) : Sugawa, et al.

It is certified that error appears in the above-identified patent and that said Letters Patent is hereby corrected as shown below:

COLUMN 12:

Line 54, "to" should read --in--.

Line 55, "the" should be deleted.

Line 60, "type" should read --types--.

COLUMN 13:

Line 34, "the" should be deleted.

COLUMN 14:

Line 28, "carrier elimination means" should read --carrier eliminating means--.

Line 44, "said" should read --and--.

Signed and Sealed this

Sixteenth Day of April, 1991

Attest:

HARRY F. MANBECK, JR.

Attesting Officer

Commissioner of Patents and Trademarks